United States Patent
Liaw

(10) Patent No.: US 11,201,159 B2
(45) Date of Patent: *Dec. 14, 2021

(54) SRAM STRUCTURE AND CONNECTION

(71) Applicant: Taiwan Semiconductor Manufacturing Co., Ltd., Hsin-Chu (TW)

(72) Inventor: Jhon Jhy Liaw, Hsinchu County (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 0 days.

This patent is subject to a terminal disclaimer.

(21) Appl. No.: 17/121,254

(22) Filed: Dec. 14, 2020

(65) Prior Publication Data

US 2021/0104530 A1    Apr. 8, 2021

Related U.S. Application Data

(63) Continuation of application No. 16/414,434, filed on May 16, 2019, now Pat. No. 10,868,018.

(60) Provisional application No. 62/750,642, filed on Oct. 25, 2018.

(51) Int. Cl.
| | |
|---|---|
| *G11C 7/22* | (2006.01) |
| *H01L 27/11* | (2006.01) |
| *G11C 11/419* | (2006.01) |
| *G11C 11/412* | (2006.01) |
| *H01L 23/532* | (2006.01) |

(52) U.S. Cl.
CPC ........ *H01L 27/1104* (2013.01); *G11C 11/412* (2013.01); *G11C 11/419* (2013.01); *H01L 23/53238* (2013.01)

(58) Field of Classification Search
CPC .......... H01L 27/1104; H01L 23/53238; G11C 11/412; G11C 11/419
USPC .................................................. 365/189.011
See application file for complete search history.

(56) References Cited

U.S. PATENT DOCUMENTS

| | | |
|---|---|---|
| 5,933,725 A | 8/1999 | Kirsch et al. |
| 8,772,109 B2 | 7/2014 | Colinge |
| 8,785,285 B2 | 7/2014 | Tsai et al. |
| 8,816,444 B2 | 8/2014 | Wann et al. |
| 8,823,065 B2 | 9/2014 | Wang et al. |

(Continued)

FOREIGN PATENT DOCUMENTS

| | | |
|---|---|---|
| KR | 20170090981 | 8/2017 |
| KR | 20180003404 | 1/2018 |

*Primary Examiner* — Huan Hoang
(74) *Attorney, Agent, or Firm* — Haynes and Boone, LLP

(57) ABSTRACT

A semiconductor structure includes SRAM cells, bit-line edge cells, and word-line edge cells, wherein the SRAM cells are arranged in an array, bordered by the bit-line edge cells and the word-line edge cells, each of the SRAM cells including two inverters cross-coupled together and a pass gate coupled to the two inverters, and the pass gate includes a FET; a first bit-line of a first metal material, disposed in a first metal layer, and electrically connected to a drain feature of the FET; a first word-line of a second metal material, and electrically connected to a gate electrode of the FET, and disposed in a second metal layer; and a second bit-line of a third metal material, electrically connected to the first bit-line, and disposed in a third metal layer. The first metal material and the third metal material are different from each other in composition.

20 Claims, 14 Drawing Sheets

(56) References Cited

U.S. PATENT DOCUMENTS

| | | |
|---|---|---|
| 8,860,148 B2 | 10/2014 | Hu et al. |
| 9,105,490 B2 | 8/2015 | Wang et al. |
| 9,236,267 B2 | 1/2016 | De et al. |
| 9,236,300 B2 | 1/2016 | Liaw |
| 9,520,482 B1 | 12/2016 | Chang et al. |
| 9,576,814 B2 | 2/2017 | Wu et al. |
| 10,115,728 B1 * | 10/2018 | Liu ................. H01L 21/823821 |
| 10,868,018 B2 * | 12/2020 | Liaw ................. H01L 23/53209 |
| 2017/0243634 A1 | 8/2017 | Kohara |
| 2017/0243919 A1 | 8/2017 | Seong et al. |
| 2018/0005938 A1 | 1/2018 | Liaw |

\* cited by examiner

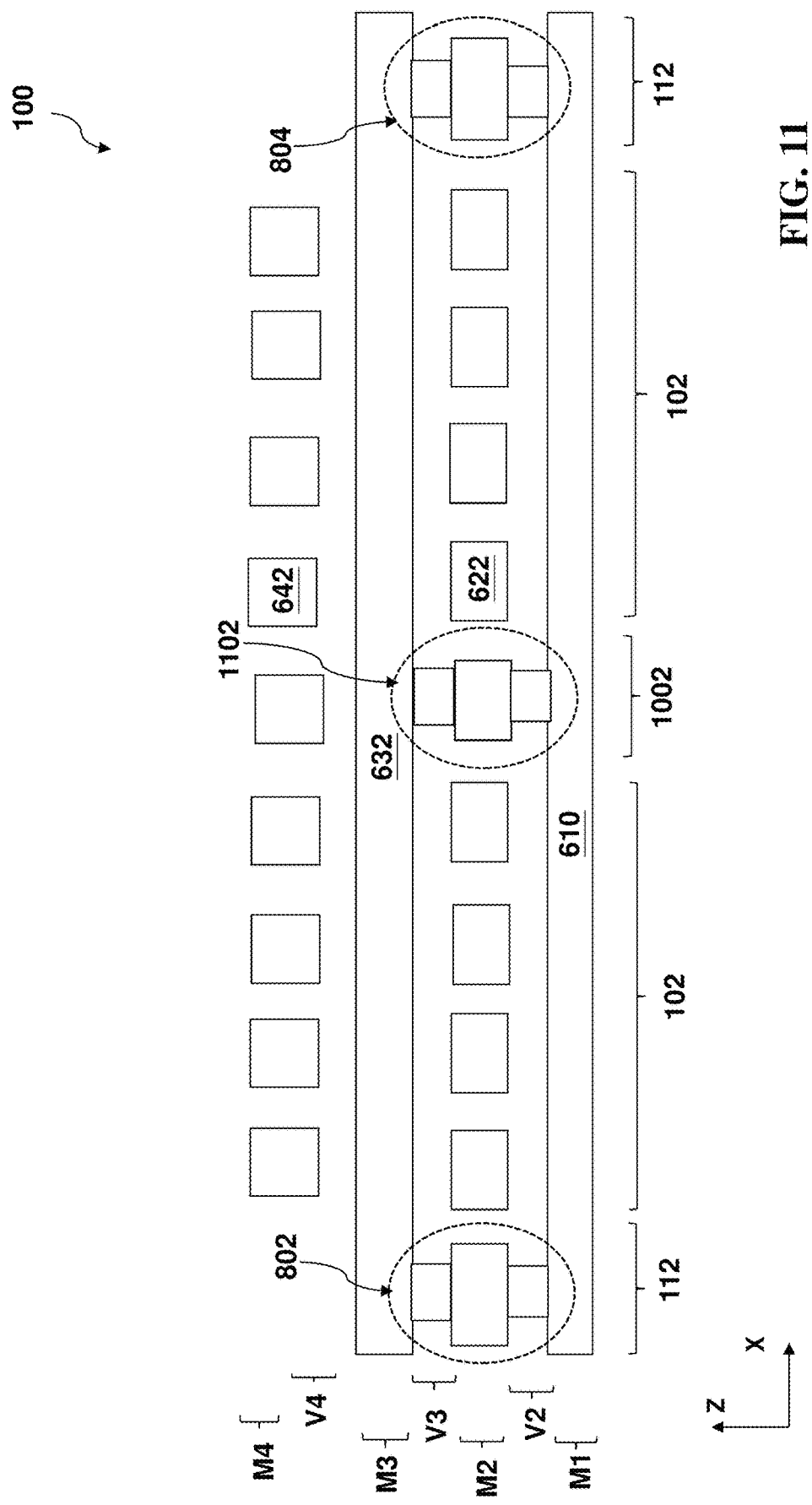

SRAM STRUCTURE AND CONNECTION

PRIORITY DATA

This application is continuation of U.S. patent application Ser. No. 16/414,434 filed May 16, 2019, which further claims priority to U.S. Provisional Patent Application Ser. No. 62/750,642 filed Oct. 25, 2018, the entire disclosures of which are hereby incorporated by reference.

BACKGROUND

An integrated circuit includes various circuits with respective functions, such as a memory circuit having a plurality of memory bit cells to retain information. The memory circuit includes non-volatile devices or volatile devices. For example, the volatile devices include static-random-access memory (SRAM) devices. When metal interconnection is continuously scaling down for logic circuit routing density improvement, the existing copper damascene scheme faces copper filling problem in tighter pitch metal layers, due to copper metal lines require diffusion barrier metal layer for reliability consideration. These barrier metal layers will impact the trench filling capability and therefore result in metal resistance degradation or even worse, such as via opening or electro-migration (EM) concern. It is therefore desired to have a new structure and design of memory circuits to address the above concern with increased packing density.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion. Various drawings and associated text are provided in a Power Point file. Particularly.

FIG. 11 is a sectional view of the integrated circuit of FIG. 10 along the dashed line EE', constructed in accordance with some embodiments.

DETAILED DESCRIPTION

Figure 1:
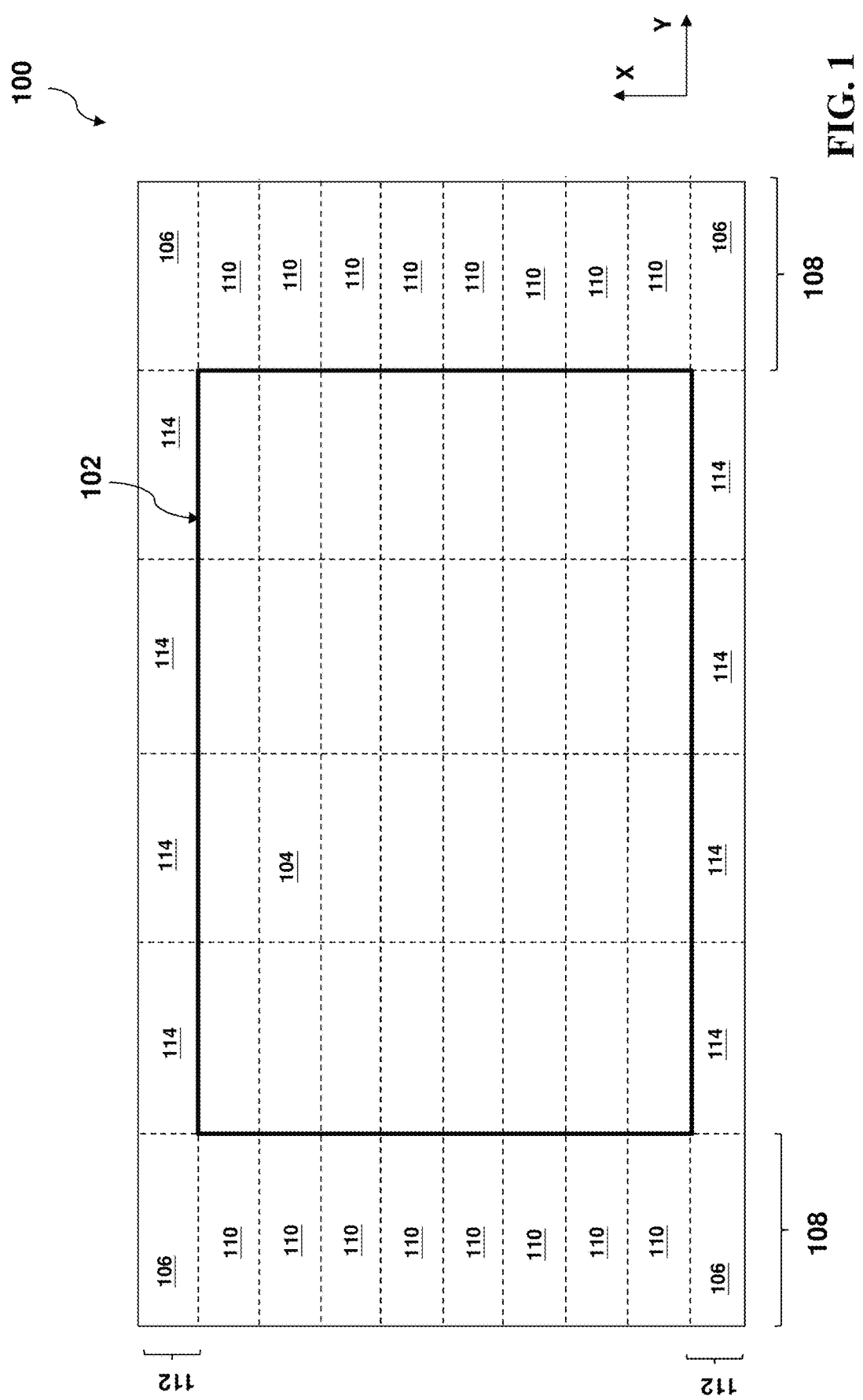
FIG. 1 is a top view of an integrated circuit having static random-access memory (SRAM) devices, constructed according to various aspects of the present disclosure in some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Still further, when a number or a range of numbers is described with "about," "approximate," and the like, the term is intended to encompass numbers that are within +/−10% of the number described, unless otherwise specified. For example, the term "about 5 nm" encompasses the dimension range from 4.5 nm to 5.5 nm.

FIG. 1 is a top view of an integrated circuit (IC) 100 constructed according to various aspects of the present disclosure in one embodiment. In some embodiments, the integrated circuit 100 is formed on fin active regions and includes fin field-effect transistors (FinFETs). In some embodiments, the integrated circuit 100 is formed on flat fin active regions and includes effect transistors (FETs). The integrated circuit 100 includes a static-random-access memory (SRAM) circuit having a SRAM array 102 of a plurality of SRAM bit cells (or SRAM cells) 104 configured in an array, spanning into multiple columns along and multiple rows. In the present embodiments, each column spans along the X direction and each row spans along the Y direction. For examples, each column may include $N_1$ SRAM bit cells configured in a line (a column) along the X direction, and each row may include $N_2$ SRAM bit cells configured in a line (a row) along the Y direction. In other words, the SRAM array 102 includes SRAM bit cells configured in $N_1$ rows and $N_2$ column. In some embodiments of the SRAM array 102, each column includes 8, 16, 32, 64 or 128 SRAM bit cells, and each row may include 4, 8, 16, or 32 SRAM bit cells. In the example illustrated in FIG. 1, the SRAM array 102 includes 4 columns and 8 rows.

Still referring back to FIG. 1, the integrated circuit 100 further includes corner dummy cells 106 disposed on four corners of the SRAM array 102 and edge straps, such as word-line edge straps (WL edge straps) 108 disposed on raw edges of the SRAM array 102 and bit-line edge straps (BL edge straps) 112 disposed on column edges of the SRAM array 102. Each WL edge strap 108 includes a plurality of WL edge cells 110 configured in a line along X direction and each BL edge strap 112 includes a plurality of BL edge cells 114 configured in a line along Y direction. Those edge straps (108 and 112) are circuit regions not designed to serve as SRAM bit cells but to provide other functions as described later.

Each SRAM bit cell 104 includes two inverters cross-coupled together to store a bit of data and further includes a pass gate electrically connected to the two inverters for reading from and write into the SRAM bit cell. The SRAM bit cell 104 is further illustrated in FIG. 2 in a schematic view, constructed in accordance with some embodiments. The SRAM bit cell 104 includes a first pull-up device ("PU-1") and a first pull-down device ("PD-1") connected into a first inverter. The SRAM bit cell 104 further includes a second pull-up device ("PU-2") and a second pull-down device ("PD-2") connected into a second inverter. The first and second inverters are cross-coupled to form a data storage unit. The SRAM bit cell 104 further includes a pass gate electrically connected to the two inverters for data reading and writing. In the present embodiment, the SRAM bit cell 104 includes a dual port SRAM device having two pass gates ("PG-1" and "PG-2"). The SRAM bit cell include field-effect transistors (FETs) to form pass gate(s) and the inverters. In the present embodiment, each of the pull-up devices (PU-1 and PU-2) includes a p-type FET; each of the pull-down devices (PD-1 and PD-2) includes a n-type FET; and each of the pass gates (PG-1 and PG-2) includes a n-type FET. The pull-up devices, the pull-down devices and the pass gates each may include more than one corresponding FET or different number of FETS to tune the SRAM bit cell performance, such as sink current, access speed, and/or device reliability. For example, the number of FETs in the pull-down devices is greater than the number of FETs in the pass-gate devices.

Specifically, the drains of the first pull-up device (PU-1) and the first pull-down device (PD-1) are electrically connected together, defining a first drain node (or first node) 202. The drains of the second pull-up device (PU-2) and the second pull-down device (PD-2) are electrically connected together, defining a second drain node (or second node) 204. The gates of PU-1 and PD-1 are electrically connected together and coupled to the second node 204. The gates of PU-2 and PD-2 are electrically connected together and coupled to the first node 202. The sources of PU-1 and PU-2 are electrically connected to the power line (Vdd line). The sources of PD-1 and PD-2 are electrically connected to a complementary power line (Vss line).

Figure 2:
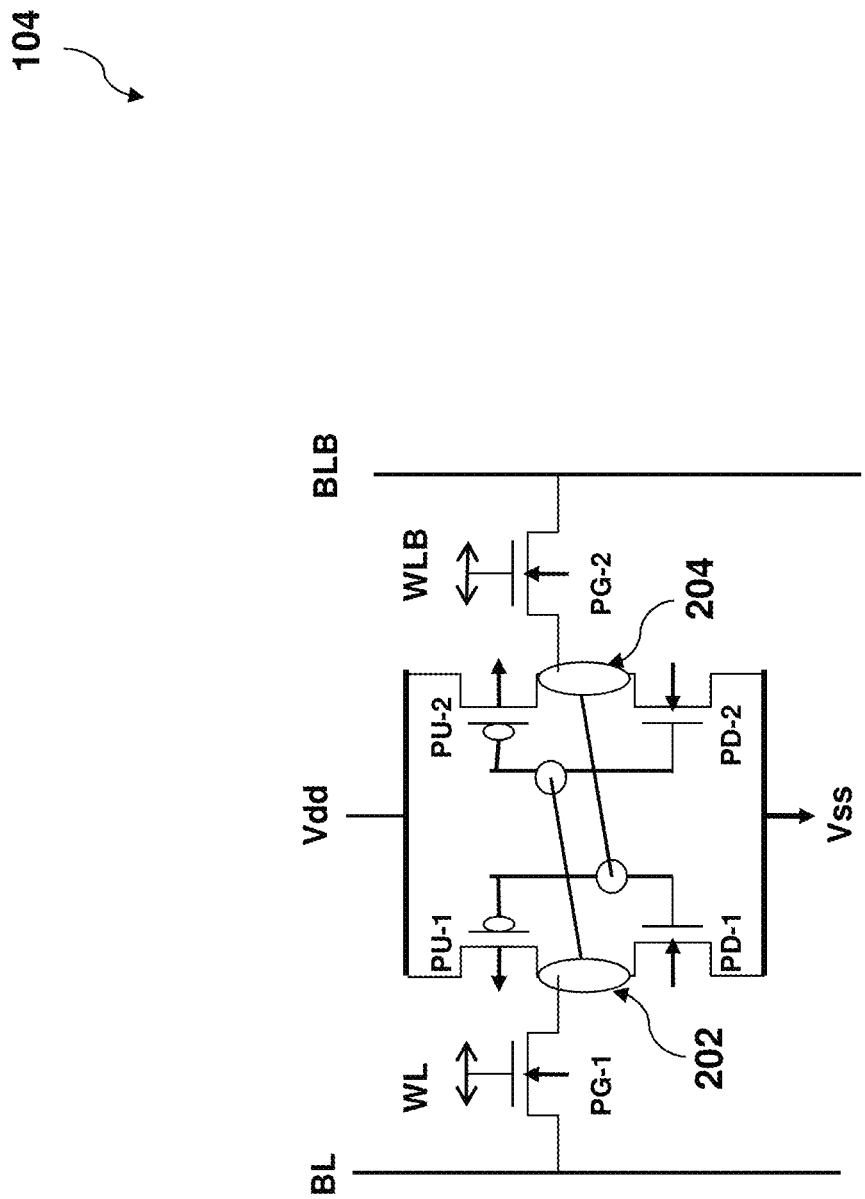
FIG. 2 is a schematic view of a SRAM bit cell in the integrated circuit of FIG. 1, in accordance with some embodiments.

Still referring to FIG. 2, the SRAM bit cell 104 includes dual ports: a first port associated with the first pass gate (PG-1) and a second port associated with the second pass gate (PG-2). The pass-gate devices each includes a n-type FET. In some embodiments, each pass gate may include more than one FET as noted above. The drain of PG-1 is electrically connected to a bit-line ("BL"). The source of PG-1 is electrically connected to the first node 202. The gate of PG-1 is electrically connected to a word-line ("WL"). The drain of PG-2 is electrically connected to a complimentary bit-line or bit-line bar ("BLB"). The source of PG-2 is electrically connected to the second node 204. The gate of PG-2 is electrically connected to a complimentary word-line or word-line bar ("WLB"). Various nFETs and pFETs may be formed by any proper technology, such as fin-like FETs (FinFETs) that includes n-type FinFETs (nFinFETs) and p-type FinFETs (pFinFETs). In one embodiment, the various nFinFETs and pFinFETs are formed by a process including etching a semiconductor to form trenches, partially filling (such as by a procedure that includes deposition, chemical mechanical polishing and etching to recess) the trenches to form shallow trench isolation (STI) features and fin active regions. In furtherance of the present embodiment, an epitaxy semiconductor layer is selectively formed on the fin active region. In another embodiment, the various FinFETs are formed by a process including depositing a dielectric material layer on the semiconductor substrate, etching the dielectric material layer to form openings thereof, selective epitaxy growing a semiconductor material (such as silicon) on the semiconductor substrate within the openings to form fin active regions and STI features. In another embodiment, the various FinFETs may include strained features for enhanced mobility and device performance. For example, the pFinFETs may include epitaxy grown silicon germanium on a silicon substrate. The nFinFETs may include epitaxy grown silicon carbide on the silicon substrate. In another embodiment, the gate stacks in various FinFETs are formed using high k/metal gate technology, in which the gate dielectric layer includes a high-k dielectric material and the gate electrode includes metal.

Figure 3:
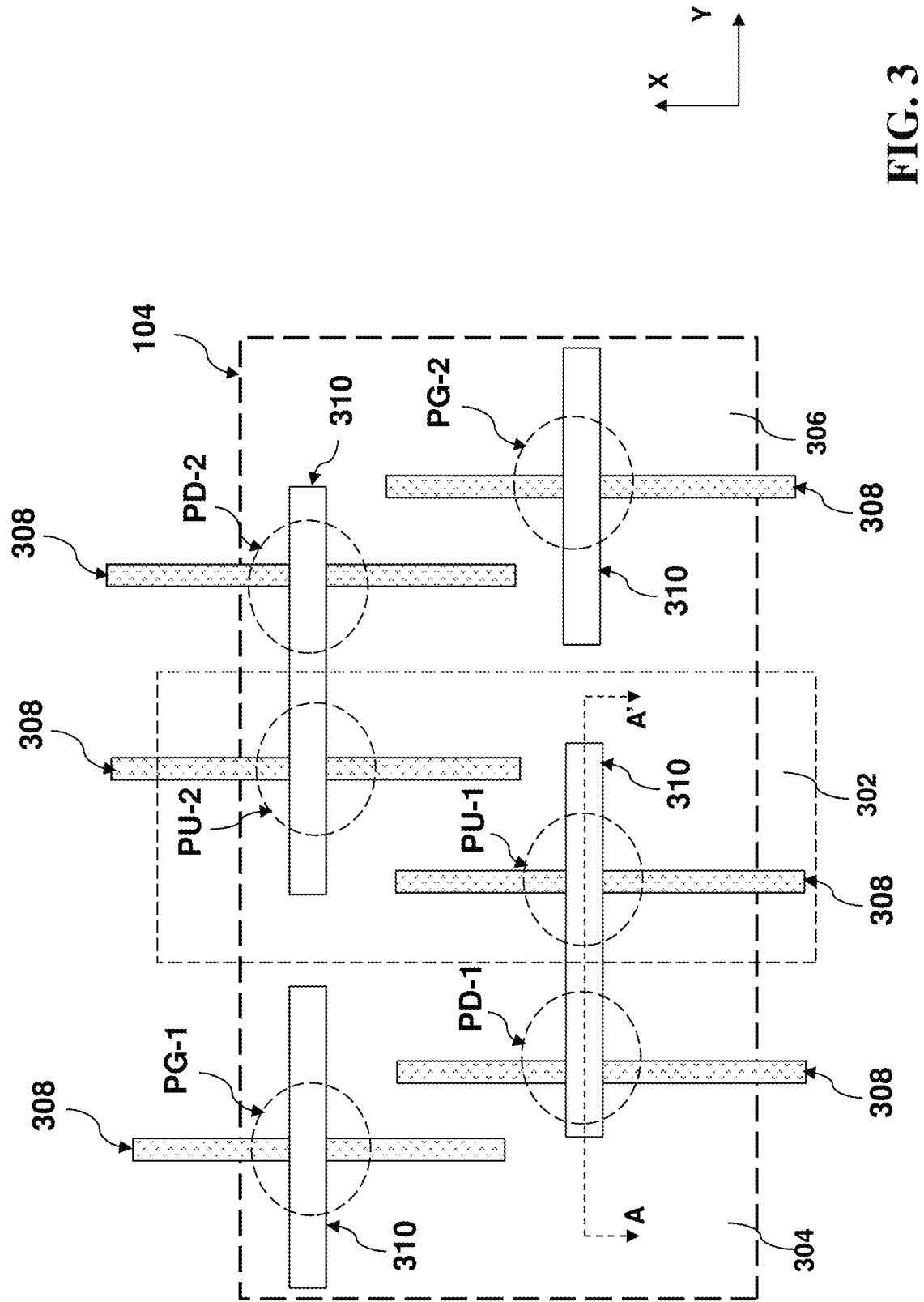
FIG. 3 is a top view of a SRAM bit cell in the integrated circuit of FIG. 1, in accordance with some embodiments.

FIG. 3 is a top view of the integrated circuit 100 in portion, particularly a SRAM bit cell 104, constructed in accordance with some embodiments. As illustrated in FIG. 3, the integrated circuit 100 includes a n-type doped well (n-well) 302 formed in the center of the SRAM bit cell 104. The n-well 302 may have an elongated shape oriented in the X direction and may extend along the X direction over multiple SRAM bit cells. The integrated circuit 100 includes a first p-type doped well (p-well) 304 and a second p-well 306 formed in sides of the n-well 302, each with elongated shape oriented in the X direction. The p-wells 304 and 306 may extends along the X direction over multiple SRAM bit cells as well. The integrated circuit 100 includes various active regions 308 disposed in the respective doped wells (such as 302, 304 and 306) with various FETs formed thereon. Those active regions 308 are surrounded and defined by isolation features, such as STI features. In some embodiments, the active regions 308 are fin-like active regions extended above the isolation features (such as STI features). In some embodiments, the fin-like active regions 308 have elongated shapes oriented in the X direction and may extend over multiple SRAM bit cells. The gates 310 of the FETs are formed on the active regions 308 and oriented along the Y direction. Especially, some active regions 308 extend from the n-well 302 from the adjacent p-well (such as 304 or 306) such that corresponding FETs (PU-1 and PD-1, or PU-2 and PD-2) share a common gate. In the present embodiment, the gate 310 over both p-well 304 and n-well 302 corresponds to a nFET for the first pull-down device (PD-1) in the p-well 304 and a pFET for the first pull-up device (PU-1) in the n-well 302; the gate 310 over both p-well 306 and n-well 302 corresponds to a nFET for the second pull-down device (PD-2) in the p-well 306 and a pFET for the second pull-up device (PU-2) in the n-well 302; the nFET for the first pass gate (PG-1) is formed in the p-well 304; and the nFET for the second pass gate (PG-2) is formed in the p-well 306.

Figure 4A:
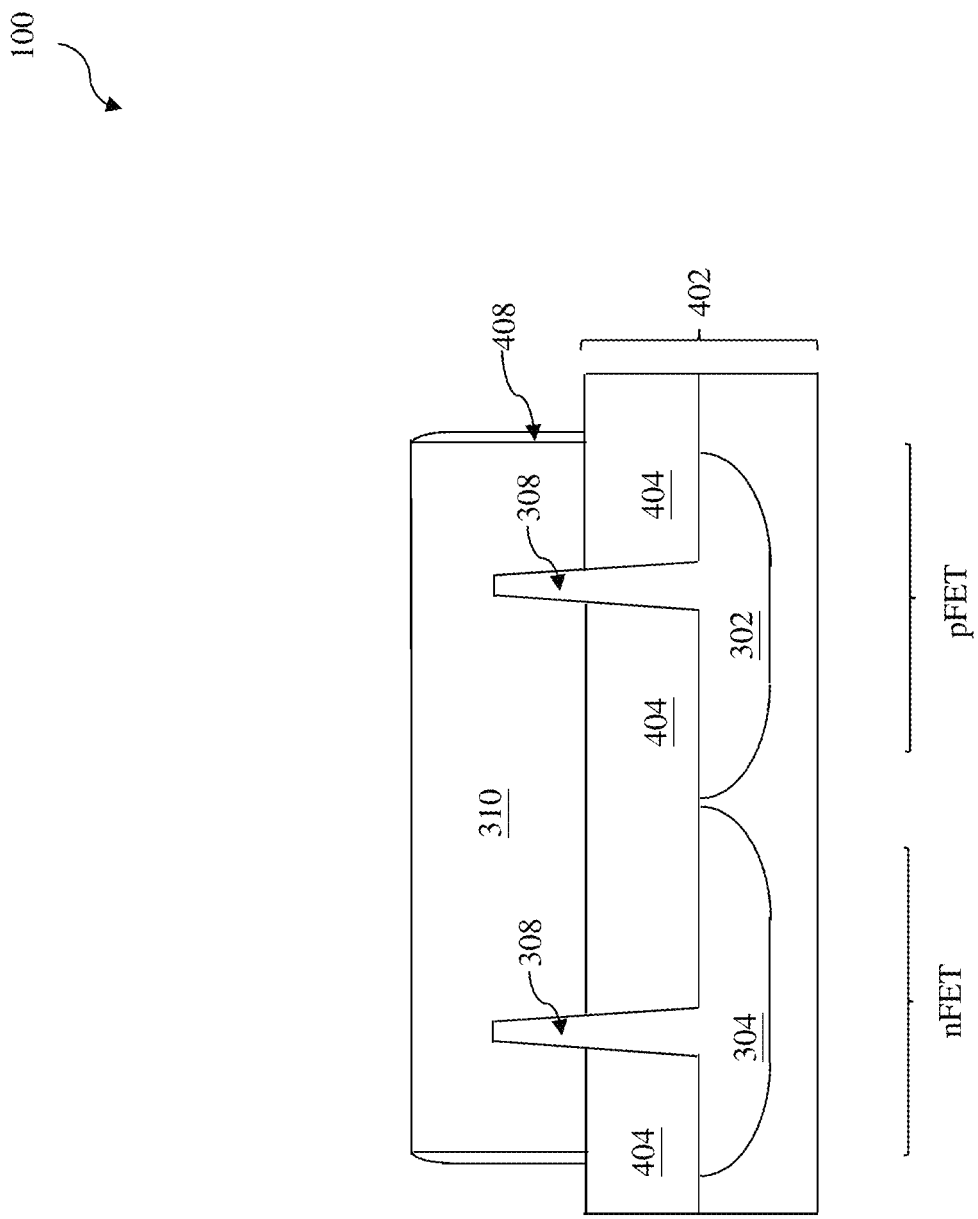
FIG. 4A is a sectional view of the SRAM bit cell of FIG. 3 along the dashed line AA', in portion, in accordance with some embodiments.
Figure 4B:
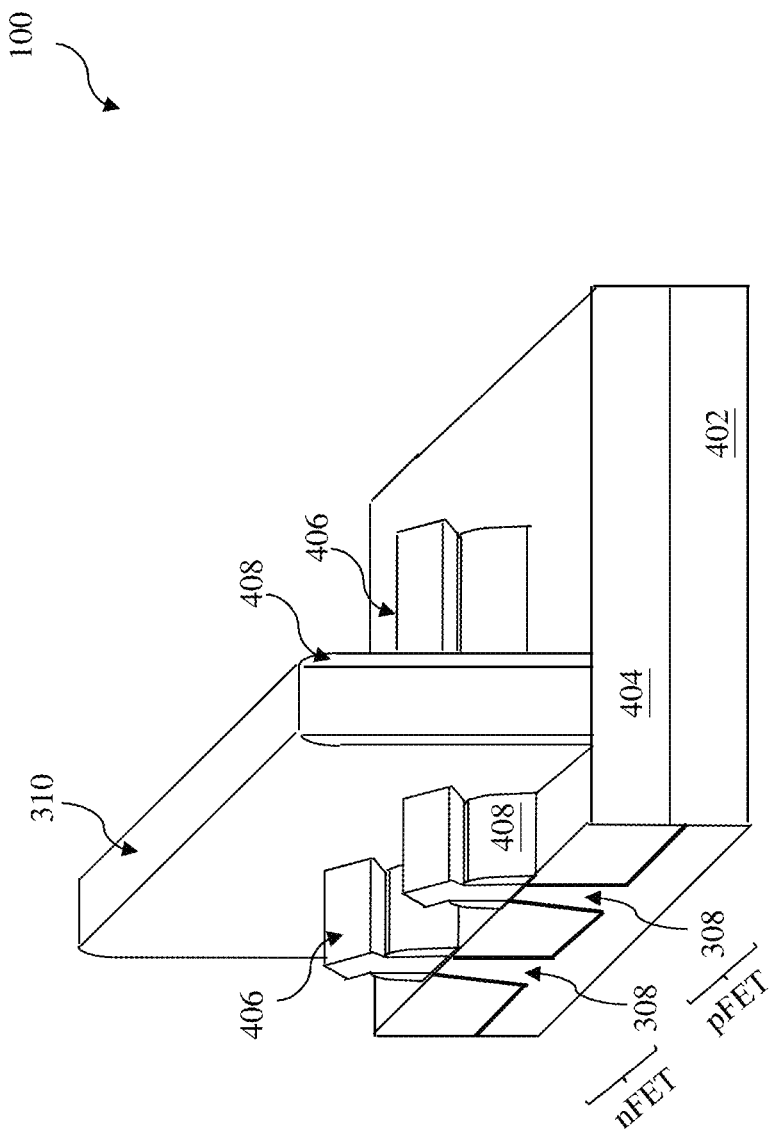
FIG. 4B is a perspective view of the SRAM bit cell of FIG. 4A, in accordance with some embodiments.

FIG. 4A is a sectional view of the integrated circuit 100, in portion, such as along the dashed line AA' of FIG. 3, constructed in accordance with some embodiments. FIG. 4B is a perspective view of the integrated circuit 100 of FIG. 4A, constructed in accordance with some embodiments. In FIGS. 4A and 4B, the integrated circuit 100 includes a semiconductor substrate 402. The semiconductor substrate 402 includes silicon. Alternatively, the semiconductor substrate 402 includes germanium, silicon germanium or other proper semiconductor materials. The integrated circuit 100 includes various isolation features 404, such as shallow trench isolation (STI) features. The integrated circuit 100 also includes various active regions 308, such as fin active regions, formed on the semiconductor substrate 402. In the illustrated embodiment where the active regions 308 are fin-like, the active regions 308 are extruded above the isolation features 404 and are surrounded and isolated from each other by the isolation features 404. The integrated circuit 100 also includes a p-well 304 and a n-well 302 formed on the semiconductor substrate 402. Various FETs are formed on the active regions 308. A nFET is disposed on the active regions 308 within the p-well 304 and a pFET is disposed on the active regions 308 within the n-well 302.

Sources and drains (S/D) 406 are formed on the active regions 308, and a gate 310 is formed on the active region 308 and disposed between the corresponding source and drain 406. In the present example, the gate 310 extends over from the first active region within the p-well 304 to the second active region within the n-well 302, therefore as a common gate shared by the corresponding nFET and pFET. The gate 310 includes a gate dielectric layer and a gate electrode disposed on the gate dielectric layer. Dielectric spacers 408 may be further formed on sidewalls of the gate 310 and sidewalls of the active regions 308 as well. A channel is a portion of the active region 308 underlying the corresponding gate 310. The corresponding source and drain 406; the gate 310; and the channel are coupled to a field effect transistor, such as a nFET or a pFET.

In various embodiments, the isolation features 404 utilize a proper isolation technology, such as local oxidation of silicon (LOCOS) and/or shallow trench isolation (STI), to define and electrically isolate the various regions. The isolation feature 404 includes silicon oxide, silicon nitride, silicon oxynitride, other suitable dielectric materials, or combinations thereof. The isolation feature 404 is formed by any suitable process. As one example, forming STI features includes using a lithography process to expose a portion of the substrate, etching a trench in the exposed portion of the substrate (for example, by using a dry etching and/or wet etching), filling the trench (for example, by using a chemical vapor deposition process) with one or more dielectric materials, and planarizing the substrate and removing excessive portions of the dielectric material(s) by a polishing process, such as CMP. In some examples, the filled trench may have a multi-layer structure, such as a thermal oxide liner layer filled with silicon nitride or silicon oxide.

In another embodiment, the gates 310 alternatively or additionally include other proper materials for circuit performance and manufacturing integration. For example, the gate dielectric layer includes high k dielectric material layer, such as metal oxide, metal nitride or metal oxynitride. In various examples, the high k dielectric material layer includes metal oxide: $ZrO_2$, $Al_2O_3$, and $HfO_2$, formed by a suitable deposition method. The gate dielectric layer may further include an interfacial layer interposed between the semiconductor substrate 402 and the high k dielectric material.

The gate electrode includes metal, such as aluminum, copper, tungsten, metal silicide, doped polysilicon, other proper conductive material or a combination thereof. The gate electrode may include multiple conductive films designed such as a capping layer, a work function metal layer, a blocking layer and a filling metal layer (such as aluminum or tungsten). multiple conductive films designed for work function matching to a nFET and a pFET, respectively. In some embodiments, the gate electrode for nFET includes a work function metal with a composition designed with a work function equal 4.2 eV or less and the gate electrode for pFET includes a work function metal with a composition designed with a work function equal 5.2 eV or greater. For examples, the work function metal layer for nFET includes tantalum, titanium aluminum, titanium aluminum nitride or a combination thereof. In other example, the work function metal layer for pFET includes titanium nitride, tantalum nitride or a combination thereof.

Figure 5:
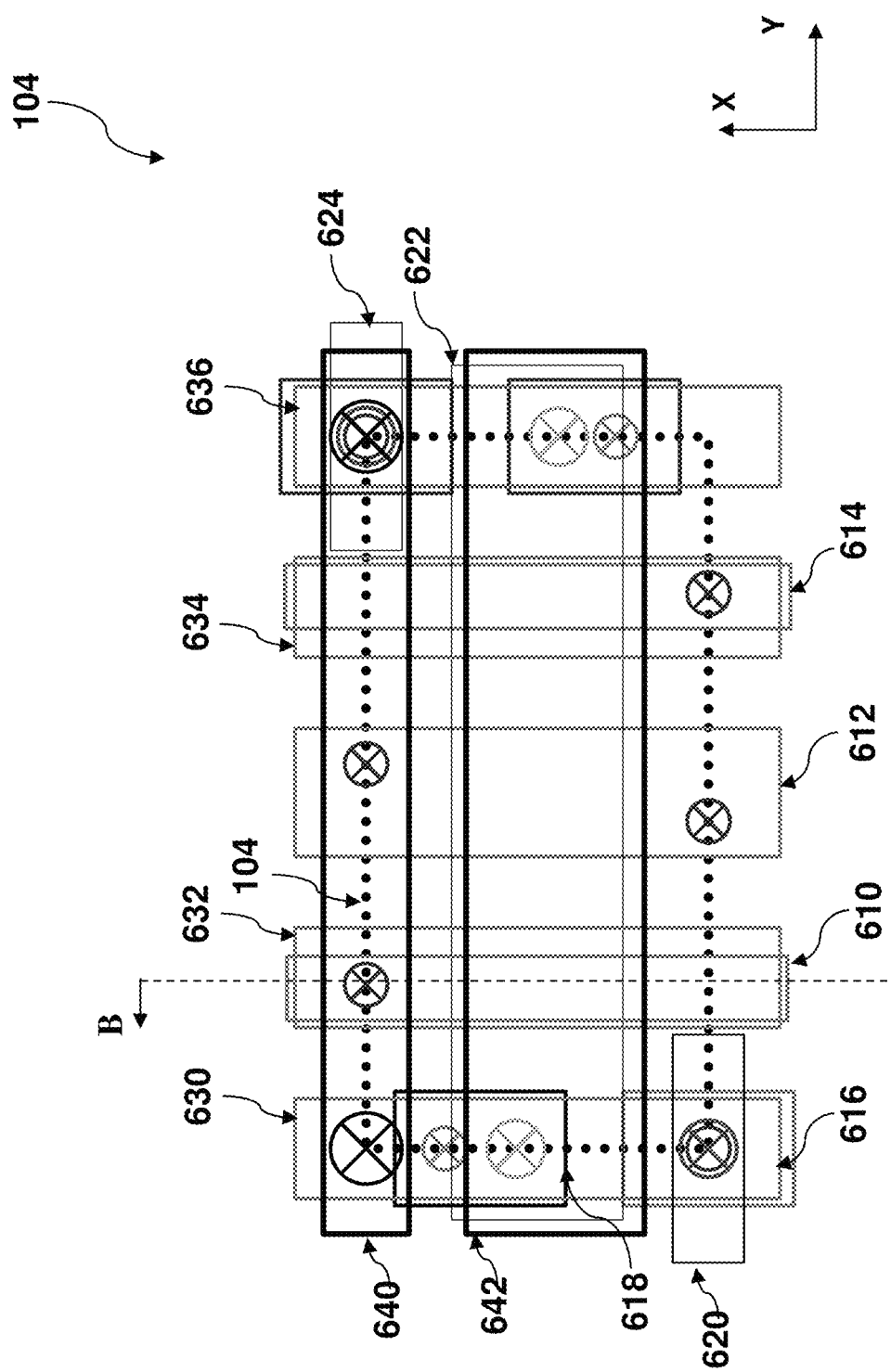
FIG. 5 is a top view of an interconnection structure over the SRAM bit cell of FIG. 3, in accordance with some embodiments.
Figure 6:
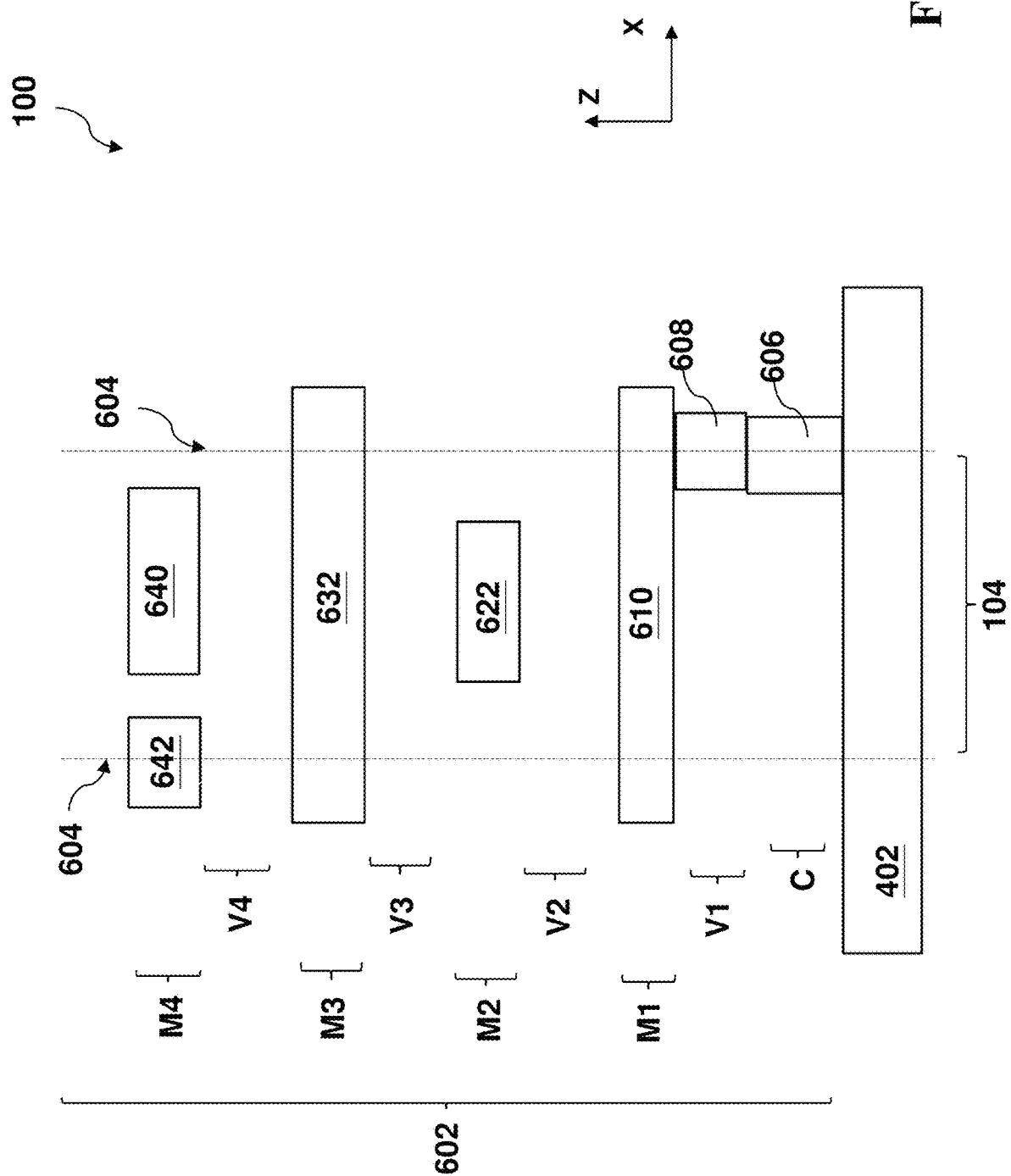
FIG. 6 is a sectional view of the interconnection structure of FIG. 5 along the dashed line BB', in accordance with some embodiments.

FIG. 5 is a top view and FIG. 6 is a sectional view, along the dashed line BB' in FIG. 5, of the integrated circuit 100 in portion, particularly an interconnection structure 602 over a SRAM bit cell 104, constructed in accordance with some embodiments. In FIG. 6, the dashed lines 604 represent the boundary of the SRAM bit cell 104. The interconnection structure 602 includes various conductive features configured to couple various FETs into a functional circuit, such as a functional SRAM circuit, or a logic circuit including a SRAM circuit. The interconnection structure 602 includes metal lines distributed in multiple metal layers to provide horizontal routing and vias between adjacent metal layers (and contacts between the semiconductor substrate and the metal features) to provide vertical routing.

Figure 14:
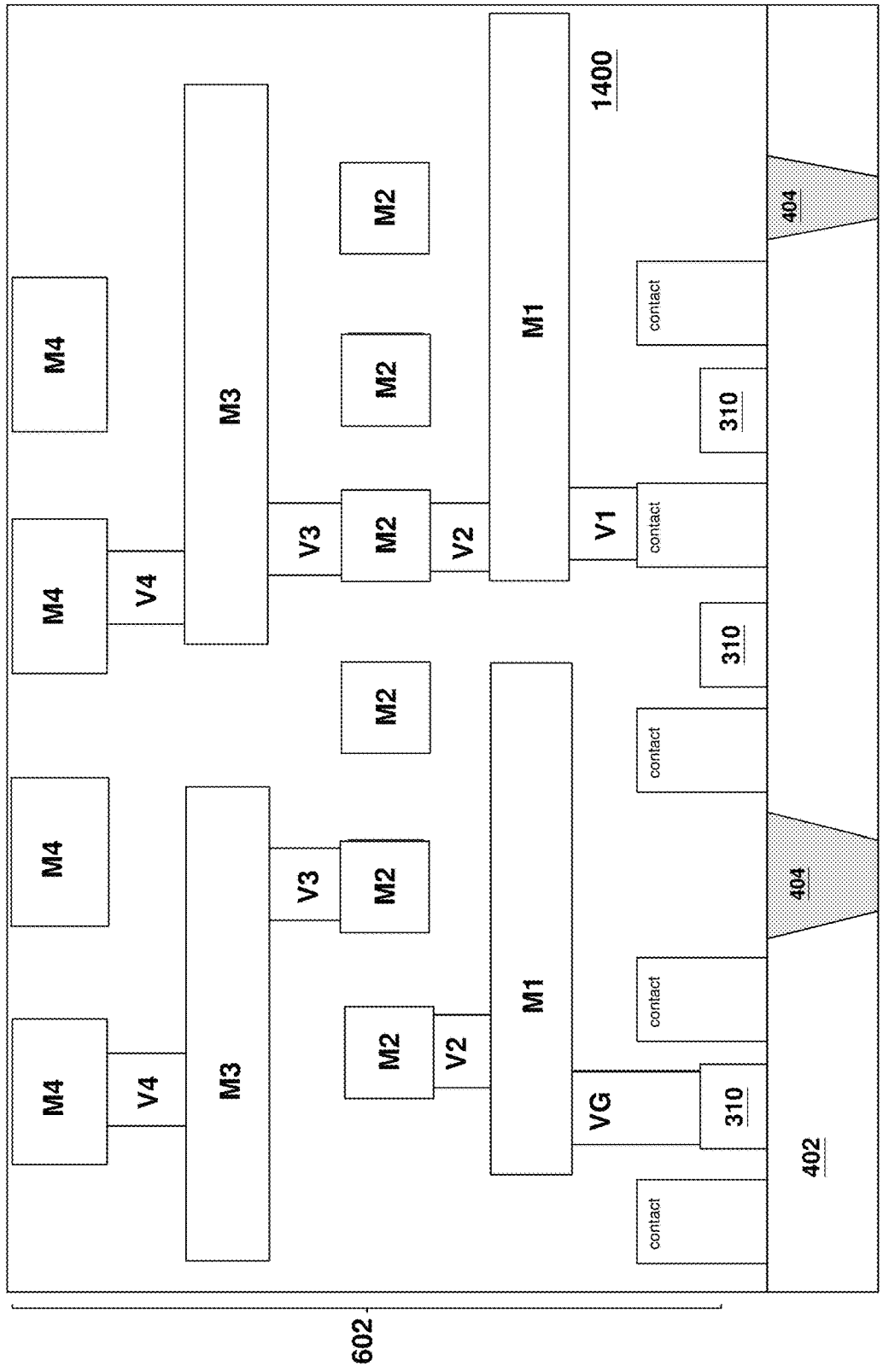
FIG. 14 is a sectional view of the interconnection structure constructed in accordance with some embodiments.

The interconnection structure 602 is disposed over the semiconductor substrate 402. Various device features, such as gates 310, the isolation features 404 and active regions 308, are not illustrated in FIGS. 5 and 6. The interconnection structure 602 includes a plurality of metal layers and corresponding vias and contacts. FIGS. 5 and 6 only illustrate 4 metal layers: a first metal layer ("M1"), a second metal layer ("M2"); a third metal layer ("M3"); and a fourth metal layer ("M4") stacked sequentially, as illustrated in FIG. 6. It is understood that the interconnection structure may include any proper number of metal layers. Each metal layer includes multiple metal lines oriented along respective directions. In the present embodiment, the metal lines in the first metal layer are oriented in the X direction, the metal lines in the second metal layer are oriented in the Y direction, the metal lines in the third metal layer are oriented in the X direction, and the metal lines in the fourth metal layer are oriented in the Y direction. Those metal lines on different metal layers are vertically connected through vias (also referred to as via features) in respective via layers ("V1", "V2", "V3" and "V4"), as illustrated in FIG. 6. There is a contact layer ("C") interposed between the first via layer and the semiconductor substrate 402. FIG. 14 is a sectional view of an interconnection structure 602, illustrating spatial relationship of via features and metal lines in different layers. In FIG. 14, the via features connected to a gate 310 is referred to as "VG". All conductive features (metal lines, via features and contacts) are embedded in an interlayer dielectric (ILD) 1400 to provide separation and isolation among various conductive features. The ILD 1400 includes a dielectric material, such as silicon oxide, low k dielectric material or a combination.

In furtherance of the present embodiment, the first metal layer includes first metal lines 610, 612 and 614 disposed in parallel. The first metal line 610 is a first bit-line (BL, see FIG. 2) connected to the drain of the nFET in the first pass gate (PG-1) through a contact 606 and a via feature 608 in the first via layer. The first metal line 612 is a first power line (Vdd) connected to the source of the pFET in the first pull-up device (PU-1) through respective contact and via. The first metal line 614 is a first bit-line bar (BLB) connected to the drain of the nFET in the second pass gate (PG-2) through respective contact and via feature.

The second metal layer includes second metal lines 620, 622 and 624 disposed in parallel. For example, the second metal line 622 is a first word-line (see WL in FIG. 2) connected to the gate of the nFET in the first pass gate (PG-1) through various contact, vias and first metal line.

The third metal layer includes third metal lines 630, 632, 634 and 636 disposed in parallel. The third metal line 630 is a complimentary power line (Vss) connected to the source of the nFET in the first pull-down device (PD-1) through respective contact and via. The third metal line 632 is a second bit-line connected to the first bit-line 610 through various vias and second metal line. The third metal line 634 is a second bit-line bar connected to the first bit-line bar 614 through various vias and second metal line. The third metal line 636 is a complimentary power line (Vss) connected to the source of the nFET in the second pull-down device (PD-2) through respective contact and via.

The fourth metal layer includes fourth metal lines 640 and 642 disposed in parallel. The fourth metal line 640 is a complimentary power line (Vss) connected to the underlying complimentary power line 630 through the intervening via in the fourth via layer. The fourth metal line 642 is a second word-line connected to the first word-line 622 through intervening vias and third metal line.

Figure 7:
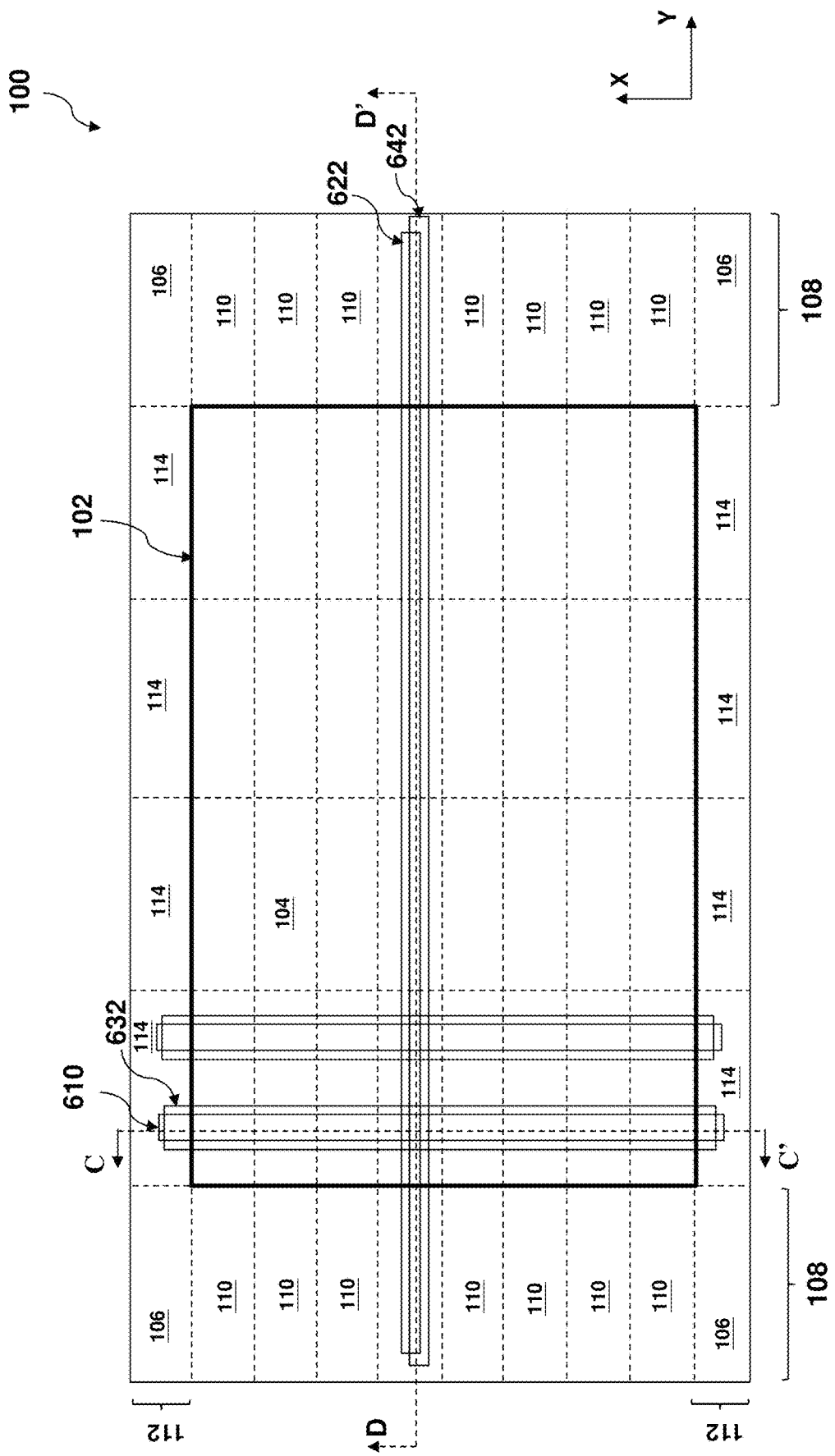
FIG. 7 is a top view of the integrated circuit of FIG. 1 with an interconnection structure, constructed in accordance with some embodiments.

Overall, the drain of a pass gate is connected to the first bit-line in the first metal layer and is then connected to the second bit-line in the third metal layer. Similarly, the gate of a pass gate is connected to the first word-line in the second metal layer and is then connected to the second word-line in the fourth metal layer. However, those bit-lines and word-lines are not connected to only one SRAM bit cell but a plurality of SRAM bit cells in the corresponding columns or rows, such as illustrated in FIG. 7 of the integrated circuit 100 in the top view. FIG. 7 is similar to FIG. 1 but exemplary bit-lines and word-lines are added to show how those metal lines connected to multiple SRAM bit cells. Only one column and one row illustration bit-lines and word-lines but it is understood that each column and each row include same bit-lines and word-lines. Provided in FIG. 7 are exemplary bit-lines and word-lines: the first bit-line 610 in the first metal layer, the second bit-line 632 in the third metal layer, the first word-line 622 in the second metal layer, and the second word-line 642 in the fourth metal layer, as those illustrated in FIG. 6.

Especially, a bit-line is connected to a high number of SRAM bit cells in the same column of the SRAM array 102, such as 32, 64 or 128 SRAM bit cells in the column of the SRAM array 102. Thus, the metal line may experience an intolerable voltage drop due to its own resistivity and length. Particularly, the lower metal lines (such as metal lines in the first metal layer) have much less dimensions and face more stringent metal filling issues. Poor metal filling may lead to filling defects, such as void, and could increase the resistance of a metal line. Considering a barrier layer is used for metal lines, the dimensions of the corresponding metal lines are further reduced. All those factors contribute to the resistance and voltage drop of the bit-line and degrade the performance of the memory cells and even the functionality. The via features and contacts have the same issues.

In the disclosed integrated circuit 100, the first, second, third and fourth metal layers use a first, a second, a third and a fourth metal material, respectively. The first metal material is different from the third metal material in composition. Furthermore, the first metal material has a resistivity greater than that of the third metal material. In the present example, the first metal material includes ruthenium (Ru), cobalt (Co), molybdenum (Mo), or a combination thereof; and the third metal material includes copper, which has a lower resistivity than above first metal material (such as Ru, Co, Mo or combination thereof).

Usually, it seems not proper choice since the lower metal, such as the first metal material, is advantages to have less resistivity for less voltage drop. However, through the experiments, it is found that thus chosen first metal material is able to be used for metal lines without necessity of barrier layer and still has robust prevention from the diffusion between the corresponding metal material and the adjacent dielectric material due to the material characteristics. Secondly, those metal materials with higher resistivity have better reflow effect, therefore better trench filling capability than copper. Additionally, copper has a longer mean free path (or average free path) and experiences conductivity reduction when the corresponding metal lines has small dimensions, such as compatible with the mean free path. This conductivity reduction may be caused by the interference between the carriers and the surfaces of the metal lines. Thus, using the first metal material (such as Ru, Co, Mo or combination thereof), with all factors collectively considered, enhances the first bit-line in the first metal layer with less resistance, less voltage drops, and more uniform performance of the SRAM bit cells. As described above, the first bit-line in the first metal layer is barrier-free while the second bit-line in the third metal layer further includes a barrier surrounding the copper metal line. In furtherance of the embodiment, the corresponding via features may use same metal materials, have similar structure, and are collectively formed with overlying metal lines. For example, the first via features in the first via layer (V1) and the first metal lines in the first metal layer (M1) are formed in a same procedure, such as a dual damascene process. Both the first metal lines and the first via features are barrier-free and include Ru, Co, Mo or combination thereof. In another example, the third via features in the third via layer (V3) and the third metal lines in the third metal layer (M3) are formed in a same procedure, such as a dual damascene process. Both the third metal lines and the third via features includes copper and further includes a barrier layer such as titanium and titanium nitride (Ti/TiN), or tantalum and tantalum nitride (Ta/TaN). In some examples, the barrier layer may use Ru. In this case, the third metal lines include copper lines with Ru film surrounding the copper lines.

For the first word-line in the second metal layer (M2) and the second word-line in the fourth metal layer (M4), the corresponding second metal lines and the fourth metal lines are configured as described below. In some embodiments, the second metal lines and the fourth metal lines (and corresponding via features) are similar to those of the first metal lines and the third metal lines (and corresponding via features) in terms of composition, structure and formation.

More particularly, the second metal material of the second metal lines includes Ru, Co, Mo or combination thereof while the fourth metal material in the fourth metal layer includes copper for the similar consideration, such as less resistance and less voltage drop. The second metal line in the second metal layer is barrier-free while the fourth metal lines in the fourth metal layer further includes a barrier layer surrounding the copper metal line. In furtherance of the embodiment, the corresponding via features may use same metal materials, have similar structure, and are collectively formed with overlying metal lines. For example, the second via features in the second via layer (V2) and the second metal lines in the second metal layer (M2) are formed in a same procedure, such as a dual damascene process. Both the second metal lines and the second via features are barrier-free and include Ru, Co, Mo or combination thereof. In another example, the fourth via features in the fourth via layer (V4) and the fourth metal lines in the fourth metal layer (M4) are formed in a same procedure, such as a dual damascene process. Both the fourth metal lines and the fourth via features includes copper and further includes a barrier layer such as Ti/TiN, or Ta/TaN. In some examples, the barrier layer may use Ru.

In some other embodiments, the second metal lines and the fourth metal lines are similar to those of the third metal lines in terms of composition, structure and composition. More particularly, the second and fourth metal lines (and the corresponding second and fourth via features) includes copper and further includes a barrier layer such as Ti/TiN, or Ta/TaN.

Figure 8:
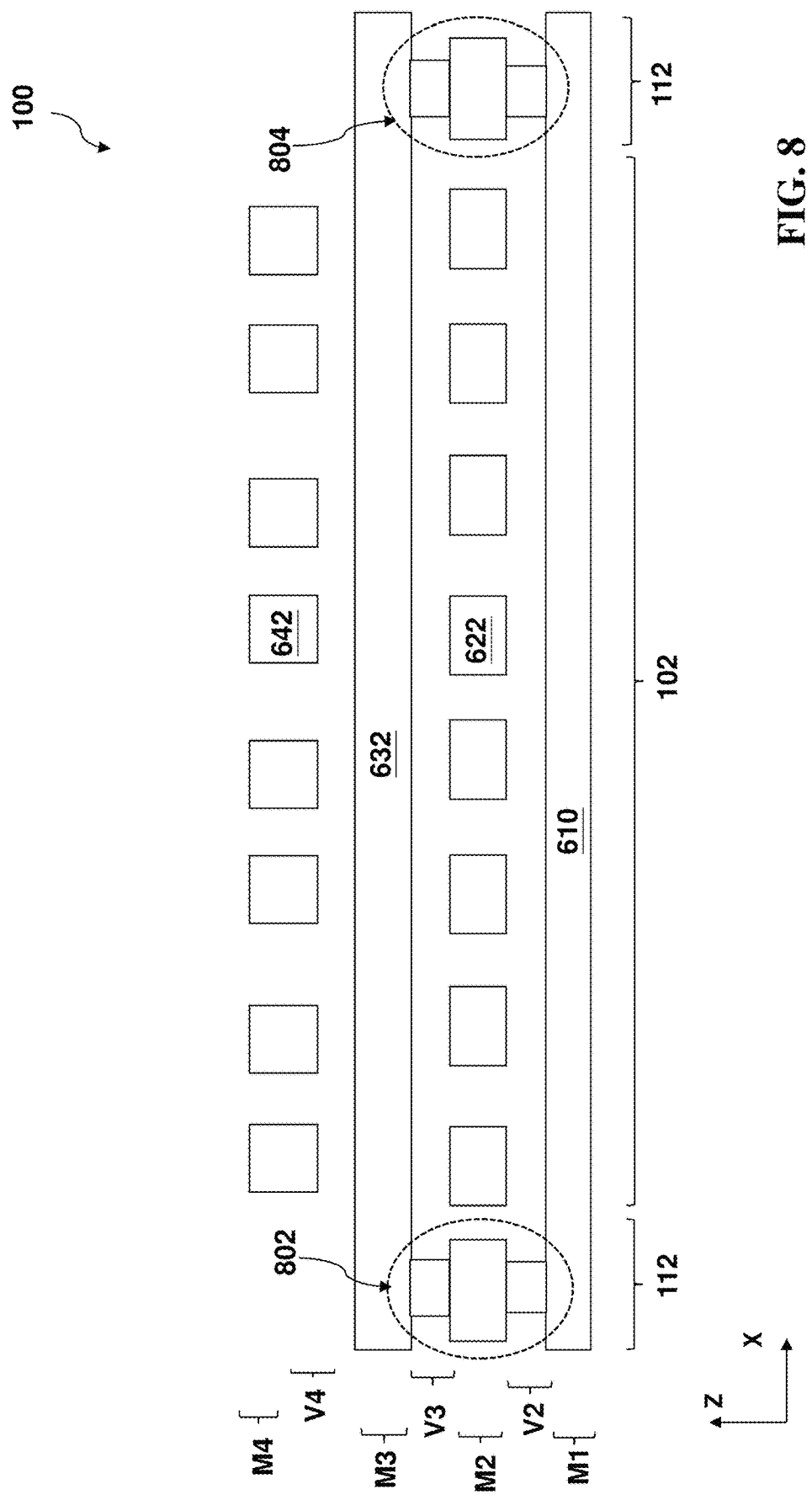
FIG. 8 is a sectional view of the integrated circuit of FIG. 7 along the dashed line CC', constructed in accordance with some embodiments.
Figure 9:
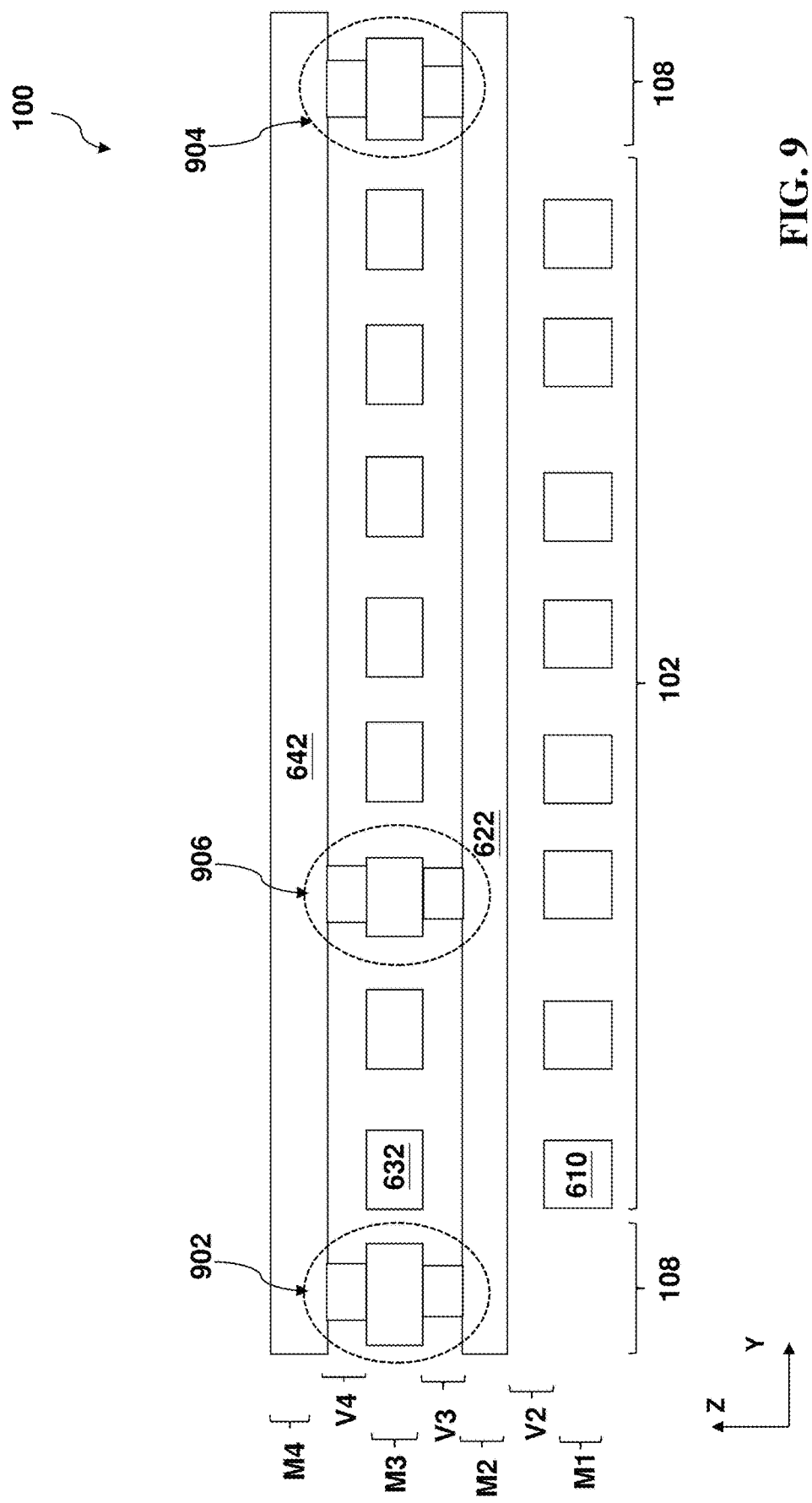
FIG. 9 is a sectional view of the integrated circuit of FIG. 7 along the dashed line DD', constructed in accordance with some embodiments.

In the present embodiment, the first bit-line in the first metal layer and the second bit-line in the third metal layer are vertically connected through intervening via features in the bit-line edge straps; and the first word-line in the second metal layer and the second word-line in the fourth metal layer are vertically connected through intervening via features in the word-line edge straps. This is illustrated in FIGS. 8 and 9. FIGS. 8 and 9 are sectional views of the integrated circuit 100 of FIG. 7 along dashed lines CC' and DD', respectively, constructed in accordance with some embodiments.

FIG. 8 incudes the SRAM array 102 and bit-line edge straps 112. The second bit-line 632 is electrically connected to the first bit-line 610 through second via features (V2), second metal lines (M2) and third via features (V3). Especially, the connected second via features (V2) and third via features (V3) are disposed within the bit-line edge straps 112, as those included in the dashed circles 802 and 804.

FIG. 9 incudes the SRAM array 102 and word-line edge straps 108. The second word-line 642 is electrically connected to the first word-line 622 through third via features (V3), third metal lines (M3) and fourth via features (V4). Especially, the connected third via features (V3) and fourth via features (V4) are disposed within the word-line edge straps 108, as those included in the dashed circles 902 and 904. In some embodiments, one or more additional connection is formed within the SRAM array 102, such as one included in the dashed circle 906.

Figure 10:
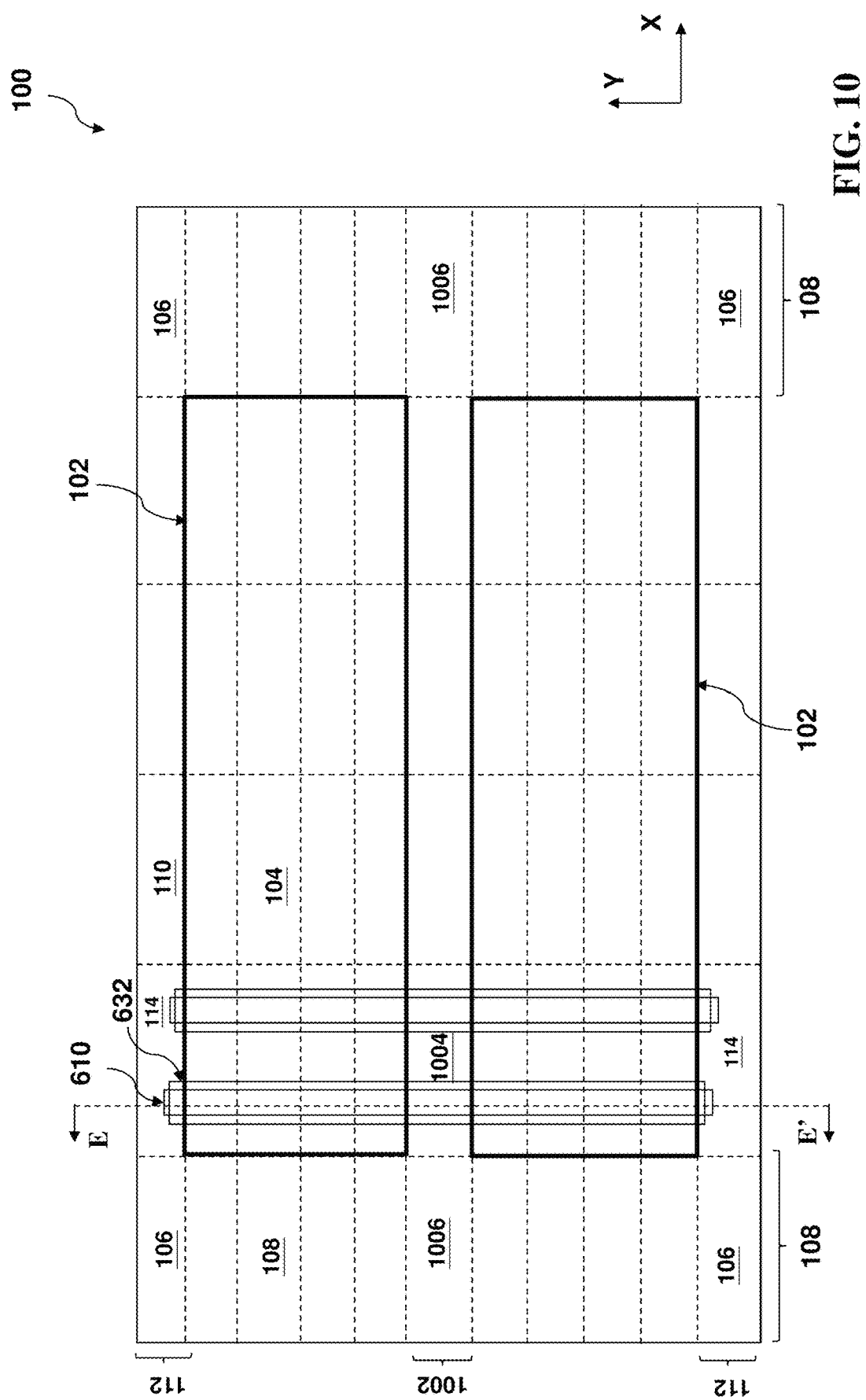
FIG. 10 is a top view of the integrated circuit of FIG. 1 with an interconnection structure, constructed in accordance with some embodiments.

In some embodiments, the integrated circuit 100 has a different layer, such as one illustrated in FIG. 10 in a top view. FIG. 10 is different from FIG. 7, which includes an additional bit-line inter strap 1002 having multiple bit-line inter cells 1004 line along the Y direction with dummy cells 1006 on the row edges. in FIG. 11 as a sectional view of FIG. 10 along the dashed line EE'. Additional connection between the second bit-line and the first bit-line can be made within the bit-line inter strap 1002. such as one included in the dashed circle 1102 in FIG. 11.

Figure 12:
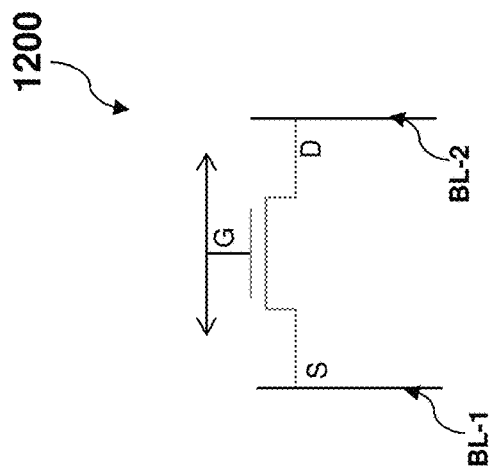
FIG. 12 is a schematic view of a write-enable unit in the integrated circuit of FIG. 1, in accordance with some embodiments.

In some embodiments, the integrated circuit 100 further includes a write-enable unit routed between the first bit-line and the second bit-line to enable the connection therebetween. In the write operation, the bit-line experiences higher current and is more sensitive to the resistance of the bit-line. The write-enable unit can control the on and off of the connection between the first and second bit-lines such that the connection can be switched on during the writing operations and switched off during the reading operations. Thus, the integrated circuit 100 is more balanced for its performance and efficiency. When it is necessary, such as during writing operations, more connections are enabled to provide more uniform voltage to various SRAM bit cells. When it is not necessary, some connections are unenabled to reduce current. The write-enable unit may be configured between the connections within a bit-line edge strap and/or a bit-line inter strap. In furtherance of the embodiments, the write-enable unit includes a transistor, such as one illustrated in FIG. 12. FIG. 12 is a schematic view of a write-enable unit 1200. In one example, the write-enable unit 1200 includes a nFET. Its source ("S") is connected to the first bit-line ("BL-1"); its drain ("D") is connected to the second bit-line ("BL-2"); and its gate ("G") is connected to a write-enable signal line, such as a metal line in the second metal layer (M2). In some examples, the write-enable unit 1200 includes two or more FETs.

Figure 13:
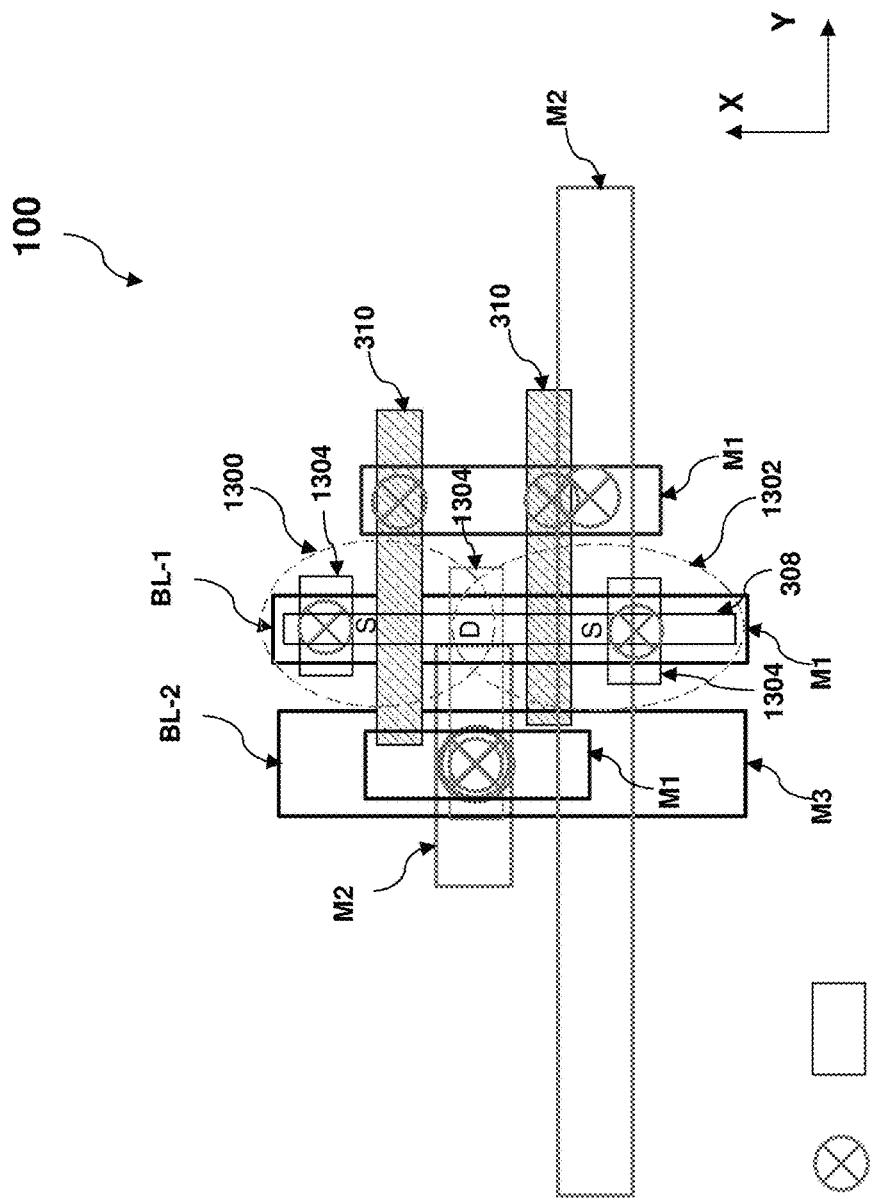
FIG. 13 is a top view of a write-enable unit and corresponding connection in the integrated circuit of FIG. 1, in accordance with some embodiments.

FIG. 13 is a top view of the integrated circuit 100, in portion, including a write-enable unit 1200, and the corresponding first and second bit-lines. FIG. 13 illustrates how the write-enable unit 1200 is utilized in the integrated circuit 100 to enable the connection between the first and second bit-lines. More particularly, the integrated circuit 100 includes an active region 308 and one or more gate 310 disposed on the active region 308, in which one or more FET is formed to serve as a write-enable unit 1200. In the present embodiment, the write-enable unit includes two FETs configured in parallel, such as those 1300 and 1302 included in the dashed circles. The corresponding sources ("S") and drains ("D") of the FETs 1300 and 1302 are labeled. The two FETs share a common drain. The integrated circuit 100 further includes first metal lines ("M1") in the first metal layer; second metal lines ("M2") in the second metal layer; third metal lines ("M3") in the third metal layer; contacts 1304; and via features (as shown in the legend) in different via layers. The gates of the FETs 1300 and 1302 are connected to the write-enable line through a first metal line (in the right portion of FIG. 13), a second metal line (in the bottom portion of FIG. 13), and vias. One first metal line (in the middle portion of FIG. 13) serves as the first bit-line (BL-1) and is connected to the sources of the FETs 1300 and 1302 through contacts and vias. One third metal line serves as the second bit-line (BL-2) and is connected to the drains of the FETs 1300 and 1302 through a first metal line, a second metal line, a contact, and via features.

The present disclosure provides various embodiments of an integrated circuit having SRAM array and its connection. The first bit-line of the SRAM array is formed in the first metal layer and the second bit-line is formed in the third metal layer using different metal materials. The metal material in the first metal layer has a resistivity greater than that of the metal material in the third metal layer. In the present example, the metal material of the first metal layer includes Ru, Co, Mo, or a combination thereof; and the metal material of the third metal layer includes Cu. Various advantages may present in various embodiments. By utilizing the disclosed interconnection structure, it enhances the first bit-line with less resistance and less voltage drops, and more uniform performance of the SRAM bit cells.

In one example aspect, the present disclosure provides a semiconductor structure includes a static random-access memory (SRAM) circuit formed on a semiconductor substrate, having SRAM bit cells, bit-line edge cells, and word-line edge cells, wherein the SRAM bit cells are arranged in an array of columns and rows, are bordered by the bit-line edge cells on column edges, and are bordered by the word-line edge cells on row edges, each of the SRAM bit cells including two inverters cross-coupled together and a pass gate coupled to the two inverters, and the pass gate including a field-effect transistor (FET); a first bit-line of a first metal material, disposed in a first metal layer, and electrically connected to a drain feature of the FET; a first word-line of a second metal material, and electrically connected to a gate electrode of the FET, and disposed in a second metal layer over the first metal layer; and a second bit-line of a third metal material, electrically connected to the first bit-line, and disposed in a third metal layer over the second metal layer, wherein the first metal material and the third metal material are different from each other in composition.

Another one aspect of the present disclosure pertains to a semiconductor structure. The semiconductor structure includes a static random-access memory (SRAM) circuit formed on a semiconductor substrate, having SRAM bit cells, bit-line edge cells, and word-line edge cells, wherein the SRAM bit cells are arranged in an array of columns and rows, are bordered by the bit-line edge cells on column edges, and are bordered by the word-line edge cells on row edges, each of the SRAM bit cells including two inverters cross-coupled together and a pass gate connected to the two inverters, and wherein the pass gate includes a field-effect transistor (FET); and an interconnection structure having multiple metal layers and disposed on the SRAM circuit; wherein the interconnection structure includes a first metal layer, a second metal layer disposed on the first metal, a third metal layer disposed on the second metal and a fourth metal layer disposed on the third metal layer. The first metal layer includes a first bit-line of a first metal material, and electrically connected to a drain feature of the FET; the second metal layer includes a first word-line of a second metal material, and electrically connected to a gate electrode of the FET; the third metal layer includes a second bit-line of a third metal material, and electrically connected to a drain feature of the FET; the fourth metal layer includes a second word-line of a fourth metal material, and electrically connected to the first word-line; and the first metal material has a resistivity greater than a resistivity of the third metal material.

Yet another aspect of the present disclosure pertains to a semiconductor structure. The semiconductor structure includes a static random-access memory (SRAM) circuit formed on a semiconductor substrate, having a SRAM array, a bit-line edge strap, and a word-line edge strap, wherein the SRAM array includes SRAM bit cells configured in an array spanning along a first direction and a second direction, wherein the bit-line edge strap includes bit-line edge cells lined along the second direction and disposed on a first edge of the SRAM array, wherein the word-line edge strap includes word-line edge cells lined along the first direction and disposed on a second edge of the SRAM array, wherein the SRAM bit cells include two inverters cross-coupled together and a pass gate connected to the two inverters, and wherein the pass gate includes a field-effect transistor (FET); a first bit-line of a first metal material, disposed in a first metal layer, and electrically connected to drain features of pass gates of the SRAM bit cells; a first word-line of a second metal material, and electrically connected to a gate electrode of the FET, and disposed in a second metal layer over the first metal layer; a second bit-line of a third metal material, disposed in a third metal layer over the second metal layer, wherein the first metal material and the third metal material are different from each other in composition; and a transistor that includes a source connected to the first bit-line, a drain connected to the second bit-line, and a gate electrode connected to a signal line to control a connection between the first and second bit-lines.

The foregoing has outlined features of several embodiments. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A semiconductor structure, comprising:
a static random-access memory (SRAM) circuit formed on a semiconductor substrate, having SRAM bit cells, bit-line edge cells, and word-line edge cells, wherein the SRAM cells are arranged in an SRAM array of columns and rows, are bordered by the bit-line edge cells on column edges, and are bordered by the word-line edge cells on row edges, each of the SRAM bit cells including two inverters cross-coupled together and a pass gate coupled to the two inverters, and the pass gate including a field-effect transistor (FET);
a first bit-line of a first metal material, disposed in first metal lines of a first metal layer, and electrically connected to a drain feature of the FET;
a first word-line of a second metal material, and electrically connected to a gate electrode of the FET, and disposed in second metal lines of a second metal layer over the first metal layer;
a second bit-line of a third metal material, electrically connected to the first bit-line, and disposed in third metal lines of a third metal layer over the second metal layer; and
a bit-line strap inserted in the SRAM array, wherein
the first bit-line includes at least one of ruthenium (Ru), cobalt (Co), and molybdenum (Mo), and is barrier-free,
the second bit-line includes copper and a barrier layer,
the first bit-line is connected to the second bit-line through a first via feature underlying the second metal layer, a first one of the second metal lines of the second metal layer, and a second via feature underlying the third metal layer, and
the first and second via features are disposed within the bit-line strap.

2. The semiconductor structure of claim 1, wherein the barrier layer includes ruthenium surrounding copper.

3. The semiconductor structure of claim 1, wherein the barrier layer includes one of titanium and titanium nitride (Ti/TiN), tantalum and tantalum nitride (Ta/TaN), and Ru.

4. The semiconductor structure of claim 1, wherein the first metal material has a resistivity greater than a resistivity of the third metal material.

5. The semiconductor structure of claim 1, further comprising:
   first via features disposed underlying the first metal layer, the drain of the FET being electrically connected to the first bit-line through one of the first via features;
   second via features vertically connecting the first metal lines of the first metal layer to the second metal lines of the second metal layer; and
   third via features vertically connecting the second metal lines of the second metal layer to the third metal lines of the third metal layer, wherein
   the first bit-line in the first metal layer is additionally electrically connected to the second bit-line in the third metal layer through a first one of the second via features, a second one of the second metal lines, and a first one of the third via features, and
   the first one of the second via features and the first one of the third via features are disposed within the bit-line edge cells.

6. The semiconductor structure of claim 5, further comprising
   a fourth metal layer of a fourth metal material, being disposed over the third metal layer;
   fourth via features vertically connecting the third metal lines of the third metal layer to fourth metal lines of the fourth metal layer; and
   a second word-line in the fourth metal layer, and electrically connected to the first word-line through a third one of the third via features, a first one of the third metal lines, and a first one of the fourth via features, wherein the third one of the third via features and the first one of the fourth via features are disposed within the word-line edge cells.

7. The semiconductor structure of claim 1, wherein the pass gate is a first pass gate, wherein the FET is a first FET, and wherein the each of the SRAM bit cells further includes a second pass gate and the second pass gate includes a second FET, wherein
   the first pass gate is connected to a common gate of the first inverter, and
   the second pass gate is connected to a common gate of the second inverter.

8. The semiconductor structure of claim 7, further comprising:
   a first complimentary bit-line of the first metal material, disposed in the first metal layer, and electrically connected to a drain feature of the second FET; and
   a write-enable unit coupled between the first and second bit-line and being operable to turn on/off a connection between the first and second bit-lines.

9. The semiconductor structure of claim 8, wherein the write-enable unit includes a transistor having a source connected to the first bit-line, a drain connected to the second bit-line, and a gate electrode connected to a signal line to turn on the transistor, thereby enabling the connection.

10. A semiconductor structure, comprising:
    a static random-access memory (SRAM) circuit formed on a semiconductor substrate, having SRAM bit cells, bit-line edge cells, and word-line edge cells, wherein the SRAM bit cells are arranged in an array of columns and rows, are bordered by the bit-line edge cells on column edges, and are bordered by the word-line edge cells on row edges, each of the SRAM bit cells including two inverters cross-coupled together and a pass gate connected to the two inverters, and wherein the pass gate includes a field-effect transistor (FET);
    a bit-line strap inserted in the SRAM array; and
    an interconnection structure having multiple metal layers and disposed on the SRAM circuit, wherein
    the interconnection structure includes a first metal layer, a second metal layer disposed on the first metal layer, and a third metal layer disposed on the second metal layer,
    the first metal layer includes a first bit-line of a first metal material, and electrically connected to a drain feature of the FET,
    the second metal layer includes a first word-line of a second metal material, and electrically connected to a gate electrode of the FET, and
    the third metal layer includes a second bit-line of a third metal material, and electrically connected to the first bit-line through a first via feature disposed within the bit-line edge cells and a second via feature disposed within the bit-line strap.

11. The semiconductor structure of claim 10, wherein the pass gate is a first pass gate, wherein the FET is a first FET, and wherein the each of the SRAM bit cells further includes a second pass gate and the second pass gate includes a second FET, wherein
    the first pass gate is connected to a common gate of the first inverter, and
    the second pass gate is connected to a common gate of the second inverter.

12. The semiconductor structure of claim 11, further comprising:
    a first complimentary bit-line of the first metal material, disposed in the first metal layer, and electrically connected to a drain feature of the second FET; and
    a write-enable unit coupled between the first and second bit-line and being operable to turn on/off a connection between the first and second bit-lines.

13. The semiconductor structure of claim 12, wherein the write-enable unit includes a transistor having a source connected to the first bit-line, a drain connected to the second bit-line, and a gate electrode connected to a signal line to turn on the transistor, thereby enabling the connection.

14. The semiconductor structure of claim 10, wherein
    the first metal material includes one of ruthenium, cobalt, and molybdenum;
    the third metal material includes copper;
    the first bit-line is barrier-free, and directly contacts an interlayer dielectric material; and
    the second bit-line further includes a barrier layer of ruthenium surrounding the third metal material.

15. The semiconductor structure of claim 10, further comprising:
    first via features disposed underlying the first metal layer, the drain of the FET being electrically connected to the first bit-line through one of the first via features;
    second via features vertically connecting first metal lines of the first metal layer to second metal lines of the second metal layer; and
    third via features vertically connecting the second metal lines of the second metal layer to third metal lines of the third metal layer, wherein
    the first bit-line in the first metal layer is further electrically connected to the second bit-line in the third metal layer through a first one of the second via features, a first one of the second metal lines, and a first one of the third via features, and the first one of the second via features and the first one of the third via features are disposed within the bit-line edge cells.

16. The semiconductor structure of claim 15, further comprising
a fourth metal layer disposed on the third metal layer,
fourth via features vertically connecting the third metal lines of the third metal layer to fourth metal lines of the fourth metal layer; and
the fourth metal layer includes a second word-line of a fourth metal material, and electrically connected to the first word-line.

17. A semiconductor structure, comprising:
a static random-access memory (SRAM) circuit formed on a semiconductor substrate, having SRAM bit cells, bit-line edge cells, and word-line edge cells, wherein the SRAM bit cells are arranged in an array of columns and rows, are bordered by the bit-line edge cells on column edges, and are bordered by the word-line edge cells on row edges, and wherein each of the SRAM bit cells includes a first inverter and a second inverter cross-coupled together, a first pass gate connected to a common gate of the first inverter, and a second pass gate connected to a common gate of the second inverter, and the first pass gate includes a first field-effect transistor (FET) and the second pass gate includes a second FET;
a first bit-line disposed in a first metal layer, and electrically connected to drain features of pass gates of the SRAM cells;
a first complimentary bit-line disposed in the first metal layer, and electrically connected to a drain feature of the second FET;
a first word-line electrically connected to a gate electrode of the FET, and disposed in a second metal layer over the first metal layer;
a second bit-line disposed in a third metal layer over the second metal layer; and
a transistor that includes a source connected to the first bit-line, a drain connected to the second bit-line, and a gate electrode connected to a signal line to control a connection between the first and second bit-lines.

18. The semiconductor structure of claim 17, further comprising a bit-line strap inserted in the SRAM array, wherein
the third metal material is electrically connected to the first bit-line through a first via feature overlying the first metal layer and a second via feature over the second metal layer,
the first via feature and the second via feature are disposed within the bit-line strap.

19. The semiconductor structure of claim 17, wherein
the first bit-line is barrier-free, includes at least one of ruthenium, cobalt, and molybdenum, and directly contacts an interlayer dielectric material; and
the second bit-line includes copper and further includes a barrier layer of ruthenium surrounding copper.

20. The semiconductor structure of claim 17, further comprising
a fourth metal layer of a fourth metal material, being disposed over the third metal layer; and
a second word-line in the fourth metal layer, and electrically connected to the first word-line through a first via feature overlying the second metal layer, one of the third metal lines, and a second via feature overlying the third metal layer, wherein the first and second via features are disposed within the word-line edge cells.

* * * * *